A method for forming a field oxide film of a semiconductor device capable of minimizing the size of bird's beak and avoiding an occurrence of crystal defect at a semiconductor substrate. The methods comprises the steps of forming a first oxide film, a first polysilicon film and a nitride film, over a semiconductor substrate, and etching predetermined portions of the nitride film and the first polysilicon film to form a field oxide region, forming a first field oxide film in the field oxide region, etching the first field oxide film to form a round recess on the semiconductor substrate, and forming a second oxide film over the round recess of the semiconductor substrate, depositing a second polysilicon film over the resulting structure, and etching the second polysilicon film without using any mask to form polysilicon film spacers at side walls of the first oxide film, first polysilicon film, and nitride film forming the field oxide region, and growing a second field oxide film over the field oxide region, etching the nitride film and the first polysilicon film, etching the first oxide film and an upper portion of the second field oxide film, and smoothing the entire exposed surface of the resulting structure to form a third field oxide film.

United States Patent [19]
Jang et al.

[11] Patent Number: 5,326,715
[45] Date of Patent: Jul. 5, 1994

[54] METHOD FOR FORMING A FIELD OXIDE FILM OF A SEMICONDUCTOR DEVICE

[75] Inventors: Se A. Jang, Ichonkun; Kyung M. Lee, Jungrangku; Chung S. Han, Seongnamsi, all of Rep. of Korea

[73] Assignee: Hyundai Electronics Industries Co., Ltd., Kyoungkido, Rep. of Korea

[21] Appl. No.: 136,566

[22] Filed: Oct. 13, 1993

[30] Foreign Application Priority Data

Oct. 13, 1992 [KR] Rep. of Korea ............... 1992-18846

[51] Int. Cl.$^5$ ........................................... H01L 21/76
[52] U.S. Cl. ...................... 437/70; 437/69; 437/72; 437/73; 437/67
[58] Field of Search ............... 437/69, 70, 72, 73, 437/67

[56] References Cited

U.S. PATENT DOCUMENTS

| | | | |
|---|---|---|---|
| 4,372,033 | 2/1983 | Chiao | 437/70 |
| 4,508,757 | 4/1985 | Fabricius et al. | 437/69 |
| 4,533,429 | 8/1985 | Josquin | 437/69 |
| 4,986,879 | 1/1991 | Lee | 437/72 |
| 5,173,444 | 12/1992 | Kawamura | 437/69 |
| 5,173,843 | 8/1992 | Kim et al. | 437/70 |
| 5,246,537 | 9/1993 | Cooper et al. | 437/69 |

Primary Examiner—Brian E. Hearn
Assistant Examiner—Trung Dang
Attorney, Agent, or Firm—Darby & Darby

[57] ABSTRACT

6 Claims, 8 Drawing Sheets

METHOD FOR FORMING A FIELD OXIDE FILM OF A SEMICONDUCTOR DEVICE

BACKGROUND OF THE INVENTION

1. Field of the Invention

The present invention relates to a method for forming a field oxide film adapted to isolate semiconductor devices formed on a wafer from one another.

2. Description of the Prior Art

In general semiconductor fabrication, devices having the same structure are fabricated in large quantities on a single wafer to perform a special function. For making such devices perform their function, it is necessary to isolate them from one another.

Examples of conventional methods for achieving such an isolation are illustrated in FIGS. 1 and 2. In the drawings, the reference numeral 1 denotes a semiconductor substrate, 2 and 7 oxide films, 3 a polysilicon film, 4 a nitride film, 5 a field oxide region, and 9 polysilicon film spacers.

One of the conventional methods will be described, in conjunction with FIG. 1.

In accordance with the illustrated conventional method, the oxide film 2 and the nitride film 4 are formed in this order over the semiconductor substrate 1. The oxide film 2 and the nitride film 4 are selectively etched to form the field oxide region 5 in which a field oxide film will be formed. For minimizing the size of bird's beak, the polysilicon film spacers 9 are formed on facing side walls of the oxide film 2 and nitride film 4 defining the field oxide region 5, respectively. The polysilicon film spacers serve as a field oxide film for providing a device isolation.

In this method, however, a crystal defect may occur at the semiconductor substrate 1 due to a stress caused by the polysilicon film spacers 9 which are in direct contact with the semiconductor substrate 1. Furthermore, there is a limitation on a reduction in bird's beak size because the field oxide film is produced by a local oxidation of silicon (LOCOS) process.

Another conventional method illustrated in FIG. 2 is adapted to reduce the length of a bird's beak portion of the field oxide film and increase a volume rate of the field oxide film disposed beneath the surface of the semiconductor substrate. This method will be described, in conjunction with FIG. 2.

Over the semiconductor substrate 1, the oxide film 2 for pads and the nitride film 4 are formed in this order. The oxide film 2 and the nitride film 4 are then selectively etched to form the field oxide region 5 through which the semiconductor substrate 1 is partially exposed. A trench having a small depth is formed at the exposed portion of the semiconductor substrate 1. A polysilicon film 3 is then formed over the exposed portion of the semiconductor substrate 1. The resulting structure is then subjected to the same process steps as the method illustrated in FIG. 1.

However, this method also has the problem of crystal defect occurred at the semiconductor substrate because the trench is formed at the semiconductor substrate.

SUMMARY OF THE INVENTION

Therefore, an object of the present invention is to solve the above-mentioned problems encountered in the prior arts and to provide a method for forming a field oxide film of a semiconductor device capable of minimizing the size of bird's beak and avoiding an occurrence of crystal defect at a semiconductor substrate, thereby improving electrical characteristics of the semiconductor device.

In accordance with one aspect, the present invention provides a method for forming a field oxide film of a semiconductor device, comprising the steps of: forming a first oxide film, a first polysilicon film and a nitride film, in this order, over a semiconductor substrate, and sequentially etching respective predetermined portions of said nitride film and said first polysilicon film to form a field oxide region; forming a first field oxide film in said field oxide region, etching said first field oxide film to form a round recess on said semiconductor substrate, and forming a second oxide film having a small thickness over said round recess of the semiconductor substrate; depositing a second polysilicon film over the entire exposed surface of the resulting structure including the field oxide region, and etching said second polysilicon film without using any mask to form polysilicon film spacers respectively at side walls of said first oxide film, first polysilicon film, and nitride film forming the field oxide region; and growing a second field oxide film over the field oxide region, etching the nitride film and the first polysilicon film, etching the first oxide film and an upper portion of said second field oxide film, and smoothing the entire exposed surface of the resulting structure to form a third field oxide film.

In accordance with another aspect, the present invention provides a method for forming a field oxide film of a semiconductor device, comprising the steps of: forming a first oxide film and a nitride film, in this order, over a semiconductor substrate, etching a predetermined portion of said nitride film to form a field oxide region, and forming a first field oxide film in said field oxide region; etching said first field oxide film to form a round recess on said semiconductor substrate, forming a second oxide film having a small thickness over said round recess of the semiconductor substrate, depositing a second polysilicon film over the entire exposed surface of the resulting structure, and etching said second polysilicon film without using any mask to form polysilicon film spacers respectively at side walls of said first oxide film and nitride film forming the field oxide region; and forming a second field oxide film over the field oxide region, etching the nitride film and the first oxide film, etching an upper portion of said second field oxide film, and smoothing the entire exposed surface of the resulting structure to form a third field oxide film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
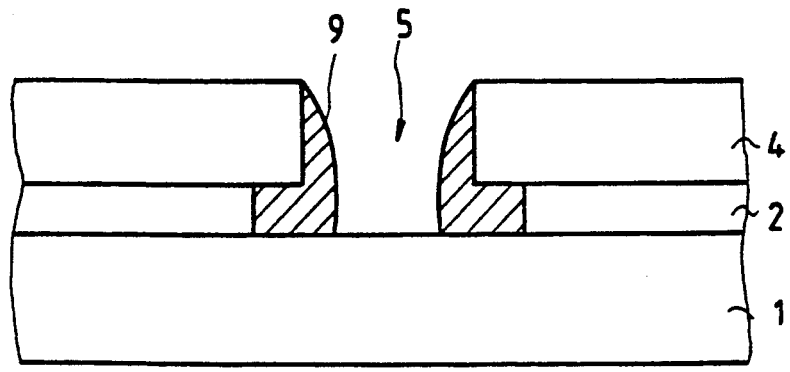
FIG. 1 is a schematic sectional view illustrating a conventional method for forming a field oxide film.
Figure 2:
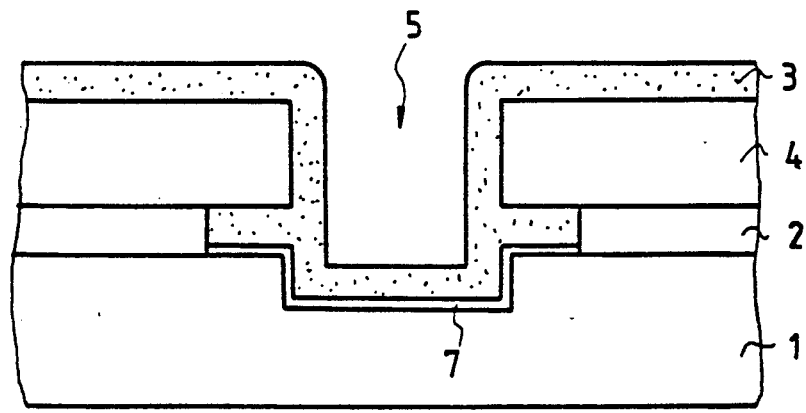
FIG. 2 is a schematic sectional view illustrating another conventional method for forming a field oxide film.

FIGS. 3A to 3G are sectional views illustrating a method for forming a field oxide film of a semiconductor device in accordance with an embodiment of the present invention. In FIGS. 3A to 3G, elements corresponding to those in FIGS. 1 and 2 are denoted by the same reference numerals.

Figure 3A:
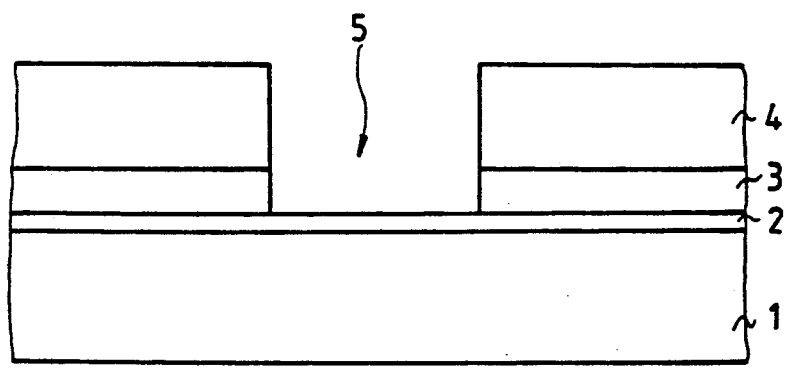
FIGS. 3A to 3G are schematic sectional views illustrating a method for forming a field oxide film in accordance with an embodiment of the present invention.

In accordance with this method, first, over a semiconductor substrate 1, an oxide film 2 is formed, as shown in FIG. 3A. The formation of oxide film 2 is achieved by oxidizing the upper portion of the semiconductor substrate 1 or depositing an oxide over the surface of the semiconductor substrate 1. Over the oxide film 2, a polysilicon film 3 and a nitride film 4 are deposited in this order. The nitride film 4 and the polysilicon film 3 are sequentially etched at their selected portions having a predetermined size for defining a field oxide region 5.

Figure 3B:
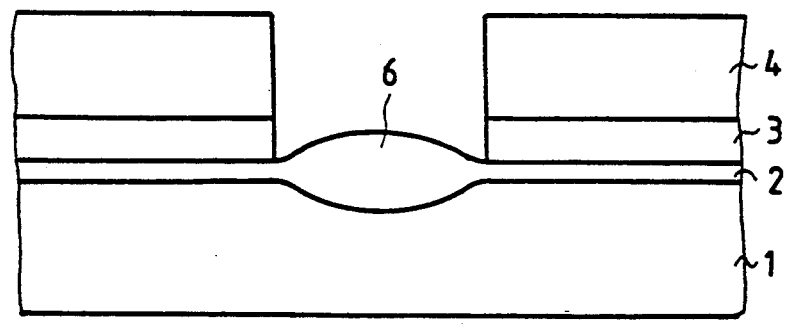

As shown in FIG. 3B, a field oxide film 6 is then formed to a thickness of 1,000 to 2,000 Å at the field oxide region 5.

Figure 3C:
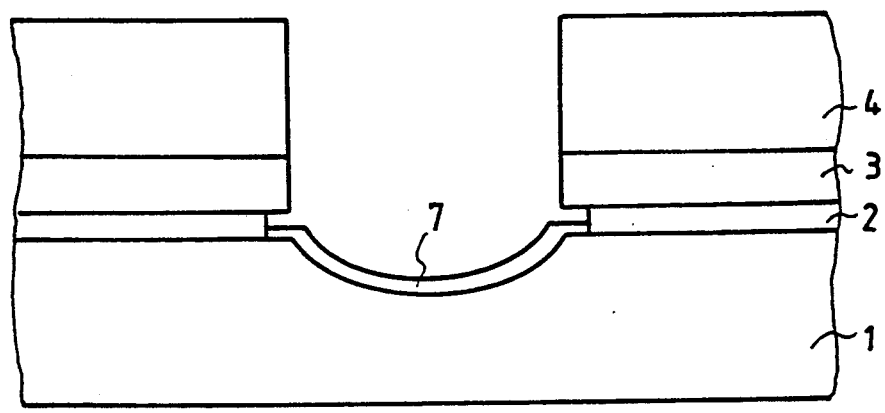

Thereafter, the field oxide film 6 is subjected to a wet etching such that the semiconductor substrate 1 has a round recess, as shown in FIG. 3C. A thin oxide film 7 is then formed over the round recess of the semiconductor substrate 1 using a thermal oxidation process.

Figure 3D:
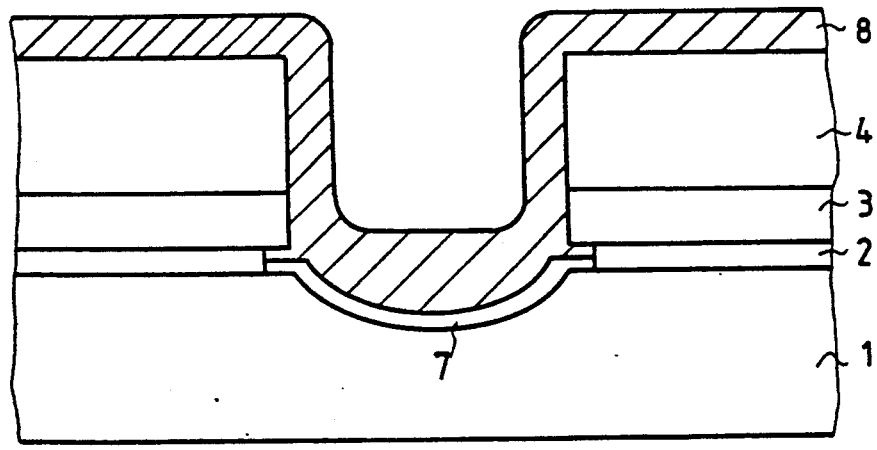

Over the exposed entire surface of the resulting structure, a polysilicon film 8 is then deposited, as shown in FIG. 3D.

Figure 3E:
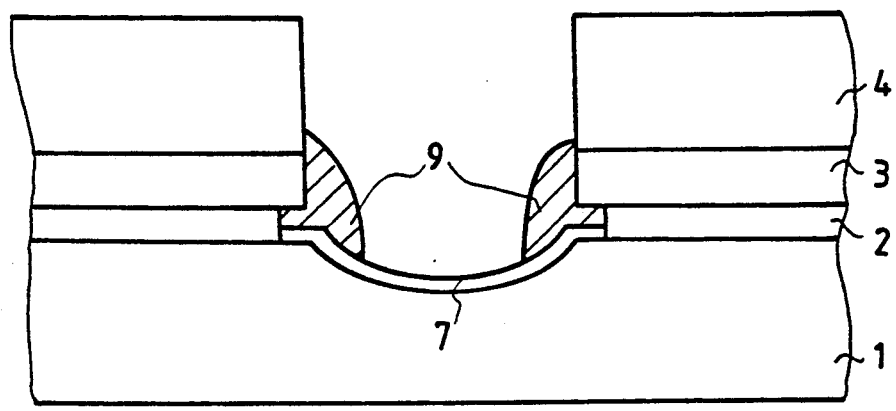

Subsequently, the polysilicon film 8 is subjected to a reactive ion etching without using any mask, thereby forming polysilicon film spacers 9, as shown in FIG. 3E. At this time, the height of each polysilicon spacer 9 is determined so that the polysilicon spacer 9 extends upwardly up to the interface between the polysilicon film 3 and the nitride film 4.

Figure 3F:
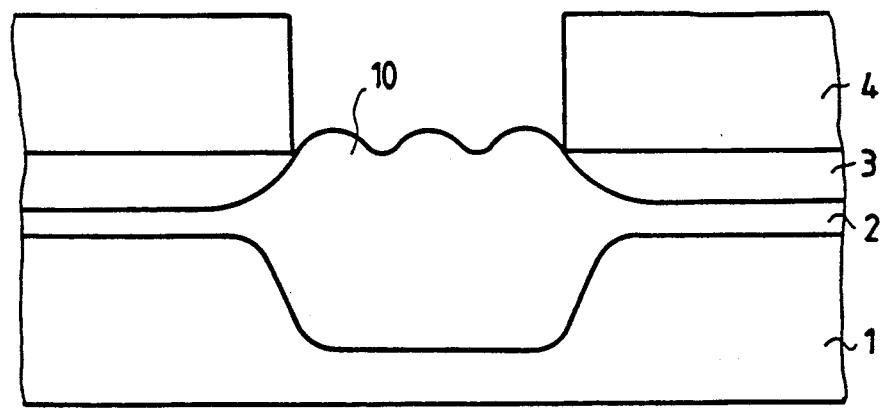

Then, a field oxide film 10 is grown in the field oxide region 5 using a general wet oxidation process, as shown in FIG. 3F.

Figure 3G:
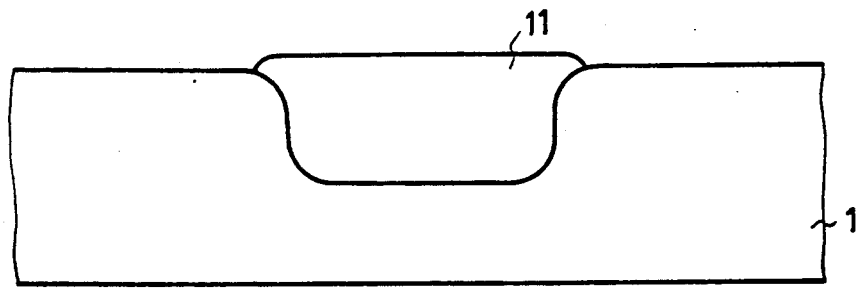

The remaining nitride film 4 and polysilicon film 3 are completely etched so as to expose the oxide film 2. The exposed oxide film 2 is then etched. At this time, the upper portion of the field oxide film 10 is also etched. Finally, the resulting structure is subjected to a smoothing process so as to obtain a field oxide film 11, as shown in FIG. 3G.

FIGS. 4A to 4F are sectional views illustrating a method for forming a field oxide film of a semiconductor device in accordance with another embodiment of the present invention. In FIGS. 4A to 4F, elements corresponding to those in FIGS. 3A to 3G are denoted by the same reference numerals.

Figure 4A:
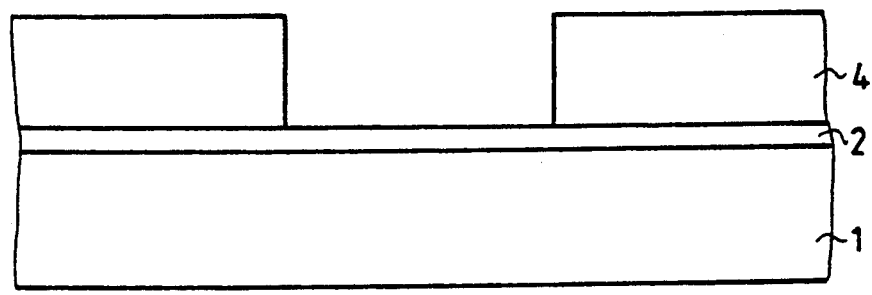
FIGS. 4A to 4F are schematic sectional views illustrating a method for forming a field oxide film in accordance with another embodiment of the present invention.

In accordance with this method, first, over a semiconductor substrate 1, an oxide film 2 and a nitride film 4 are formed in this order, as shown in FIG. 4A. The nitride film 4 is then etched at its selected portion having a predetermined size for defining a field oxide region 5. The formation of oxide film 2 may be achieved by subjecting the semiconductor substrate 1 to a thermal oxidation.

Figure 4B:
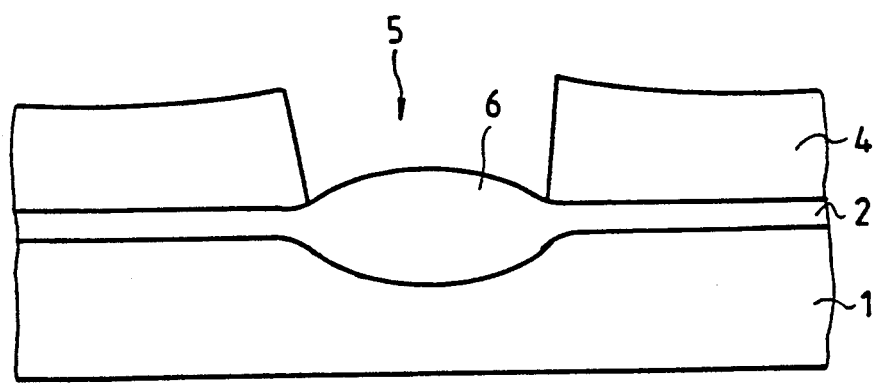

As shown in FIG. 4B, a field oxide film 6 is then formed at the field oxide region 5.

Figure 4C:
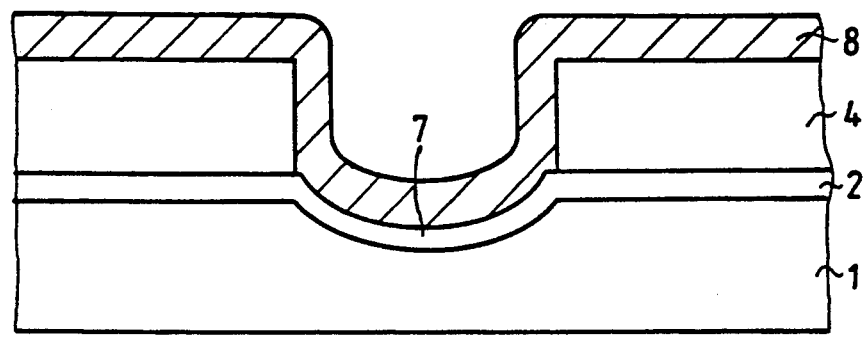

Thereafter, the field oxide film 6 is subjected to an etching such that the semiconductor substrate 1 has a round recess, as shown in FIG. 4C. A thin oxide film 7 is then formed over the round recess of the semiconductor substrate 1. Over the exposed entire surface of the resulting structure, a polysilicon film 8 is then deposited.

Figure 4D:
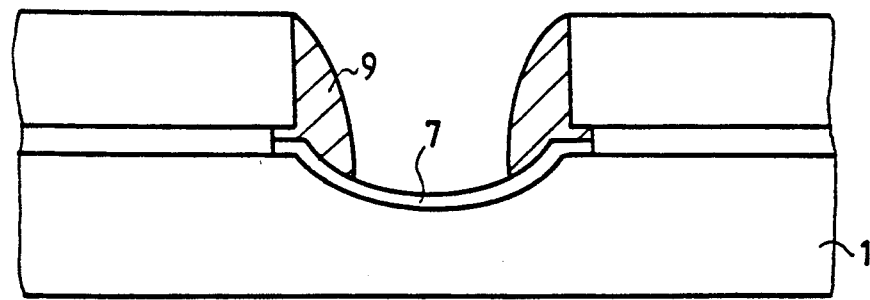

Subsequently, the polysilicon film 8 is subjected to a blanket etching, thereby forming polysilicon film spacers 9 at side walls of the oxide film 2 and the nitride film 4 forming the field oxide region, respectively, as shown in FIG. 4D.

Figure 4E:
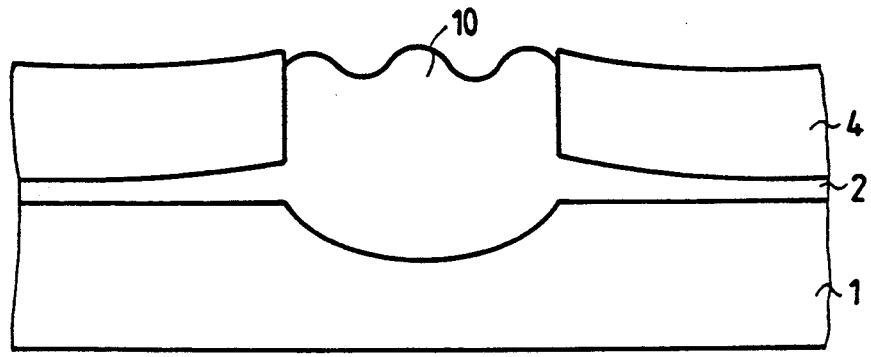

Then, a field oxide film 10 is grown over the field oxide region 5 using a general wet oxidation process, as shown in FIG. 4E.

Figure 4F:
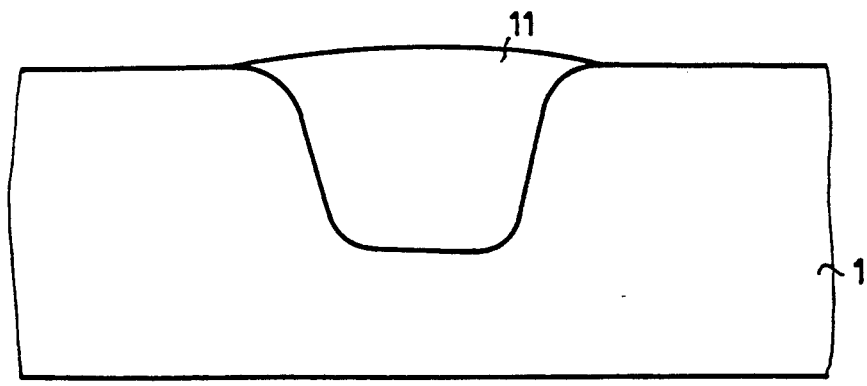

The remaining nitride film 4 and oxide film 2 are completely etched. Subsequently, the upper portion of the field oxide film 10 is etched. Finally, the resulting structure is subjected to a smoothing process so as to obtain a field oxide film 11, as shown in FIG. 4F.

As apparent from the above description, the present invention makes it possible to increase the volume ratio of the field oxide film embedded in the semiconductor substrate up to 90% or more and greatly reduce the length of bird's beak, without forming any trench in the semiconductor substrate. Since a round recess is formed on the semiconductor substrate by partially removing an oxide film thermally formed on the semiconductor substrate, an occurrence of crystal defect can be avoided. This can improve electrical characteristics of highly integrated devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a field oxide film of a semiconductor device, comprising the steps of:
    forming a first oxide film, a first polysilicon film and a nitride film, in this order, over a semiconductor substrate, and sequentially etching respective predetermined portions of said nitride film and said first polysilicon film to form a field oxide region;
    forming a first field oxide film in said field oxide region, etching said first field oxide film to form a round recess on said semiconductor substrate, and forming a second oxide film having a small thickness over said round recess of the semiconductor substrate;
    depositing a second polysilicon film over the entire exposed surface of the resulting structure including the field oxide region, and etching said second polysilicon film without using any mask to form polysilicon film spacers respectively at side walls of said first oxide film, first polysilicon film, and nitride film forming the field oxide region; and
    growing a second field oxide film over the field oxide region, etching the nitride film and the first polysilicon film, etching the first oxide film and an upper portion of said second field oxide film, and smoothing the entire exposed surface of the resulting structure to form a third field oxide film.

2. A method in accordance with claim 1, wherein said first oxide film is formed by oxidizing said semiconductor substrate or depositing an oxide over said semiconductor substrate.

3. A method in accordance with claim 1, wherein said first field oxide film has a thickness of 1,000 to 2,000 Å.

4. A method in accordance with claim 1, wherein each of said polysilicon film spacers has a height to extend to an interface between said first polysilicon film and said nitride film.

5. A method for forming a field oxide film of a semiconductor device, comprising the steps of:

forming a first oxide film and a nitride film, in this order, over a semiconductor substrate, etching a predetermined portion of said nitride film to form a field oxide region, and forming a first field oxide film in said field oxide region;

etching said first field oxide film to form a round recess on said semiconductor substrate, forming a second oxide film having a small thickness over said round recess of the semiconductor substrate, depositing a second polysilicon film over the entire exposed surface of the resulting structure, and etching said second polysilicon film without using any mask to form polysilicon film spacers respectively at side walls of said first oxide film and nitride film forming the field oxide region; and forming a second field oxide film over the field oxide region, etching the nitride film and the first oxide film, etching an upper portion of said second field oxide film, and smoothing the entire exposed surface of the resulting structure to form a third field oxide film.

6. A method in accordance with claim 5, wherein said first oxide film is formed by oxidizing said semiconductor substrate or depositing an oxide over said semiconductor substrate.

* * * * *